(12) United States Patent
Wavering et al.

(10) Patent No.: US 8,031,486 B2
(45) Date of Patent: Oct. 4, 2011

(54) ELECTRICAL DISTRIBUTION SYSTEM AND MODULAR HIGH POWER BOARD CONTACTOR THEREFOR

(75) Inventors: Jeffrey T. Wavering, Rockford, IL (US); Francis Belisle, Roscoe, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 1186 days.

(21) Appl. No.: 11/274,996

(22) Filed: Nov. 16, 2005

(65) Prior Publication Data

US 2007/0108963 A1    May 17, 2007

(51) Int. Cl.
*H01R 9/00* (2006.01)

(52) U.S. Cl. ......................................... 361/823; 361/824

(58) Field of Classification Search .................... 361/42, 361/823, 824, 760
See application file for complete search history.

(56) References Cited

U.S. PATENT DOCUMENTS

| | | |
|---|---|---|
| 4,144,551 A | 3/1979 | Smith et al. |
| 4,973,272 A | 11/1990 | Chase et al. |
| 5,508,626 A | 4/1996 | Halin et al. |
| 5,982,259 A | 11/1999 | Godfrey et al. |
| 6,091,596 A | 7/2000 | Godfrey et al. |
| 6,140,896 A * | 10/2000 | Heckenkamp ................ 335/159 |
| 6,239,395 B1 * | 5/2001 | Rosen ............................ 200/559 |
| 6,512,380 B2 | 1/2003 | Turvey |
| 6,597,154 B2 | 7/2003 | Foch et al. |
| 6,683,771 B2 | 1/2004 | Foch et al. |
| 6,791,171 B2 * | 9/2004 | Mok et al. ..................... 257/678 |
| 6,814,632 B1 | 11/2004 | Peterson |
| 6,849,962 B2 | 2/2005 | McCool |
| 7,541,900 B2 * | 6/2009 | Portier ........................... 335/159 |
| 2002/0067582 A1 * | 6/2002 | Germain et al. ................ 361/42 |

* cited by examiner

*Primary Examiner* — Kambiz Zand
*Assistant Examiner* — Abiy Getachew
(74) *Attorney, Agent, or Firm* — Carlson Gaskey & Olds PC (57) ABSTRACT

An electrical distribution system provides a Line Replaceable Modules (LRM) with a printed wire board (PWB) which is of a relatively thick construction. The PWB is manufactured of a relatively thick construction to provide structural support for a multitude of electrical components as well as a board mounted contactor. Each contactor is mounted directly to the PWB. As the primary contactor switch function is board mounted, support functions such as coil drivers, economizing switches, auxiliary switches become PWB mounted components that are assembled to the PWB for communication through the board circuit traces rather than the heretofore required wiring harnesses.

16 Claims, 7 Drawing Sheets

ELECTRICAL DISTRIBUTION SYSTEM AND MODULAR HIGH POWER BOARD CONTACTOR THEREFOR

BACKGROUND OF THE INVENTION

The present invention relates to an electrical energy distribution systems, and more particularly to a board mounted contactor therefor.

Electrical energy distribution systems typically include an electrical power source which powers a corresponding distribution circuit through a controllable power contactor which selectively interlinks a multitude of distribution circuits. Each distribution circuit is powered by its own source through a corresponding power contactor, however, should a source become defective, the distribution circuit can be powered by the source of at least one other distribution circuit through at least one contactor.

Distribution systems of this type are often utilized onboard aircraft. In this environment, each distribution circuit generally powers a distribution bus bar which then powers a plurality of electrical loads in parallel. Each power source is typically either of a generator driven by an engine of the aircraft, an auxiliary power unit or batteries.

The contactors reside in a power center assembly on a primary bus bar structure located within an aircraft electronics bay. The primary bus bars interface to the contactors through 6 threaded terminal posts, assuming it is a 3 phase, AC contactor. In addition to the primary power interfaces, a low power signal connection is required for control and sensing functions. Because the contactors are line replaceable modules (LRMs) each contactor must have an individual chassis to support a multitude of electrical components and wiring harnesses which connect the LRM to the power center assembly.

The contactors each include an economizer switch to reduce coil currents once closure occurs and a multitude of auxiliary contact switches which indicate the main contact position and who's signals are used for relay logic in the power system. Each of these auxiliary switches are mechanically linked to the contactors primary actuator through a complex set of brackets and adjustment screws. In addition, each of the switches requires a harness to provide the interface to the control and signal connector. During LRM replacement, tooling is required to remove the control and signal connector and large tooling is required to remove fasteners on the primary power interfaces. These interfaces also require a controlled re-torquing procedure and calibrated torque wrench during LRM replacement. Although effective, these features result in a relatively complex LRM that reduces reliability and may result in increased maintenance considerations when located within an aircraft environment.

Accordingly, it is desirable to provide an uncomplicated line replaceable module with a minimum of wire harness connections which reduces maintenance considerations when located within an aircraft environment.

SUMMARY OF THE INVENTION

A electrical distribution system according to the present invention includes a Line Replaceable Module (LRM) with a printed wire board (PWB) which is of a relatively thick construction. The PWB is of a relatively thick construction to provide structural support for a multitude of electrical components as well as a board mounted contactor.

The PWB supports and electrically interconnects the contactors, power interface connectors, auxiliary switches, current sensors, control interface connectors, and an onboard controller. The board mounted power interface connectors communicate power from a primary power distributing bus bar, to respective contactors through board mounted bus structure. The PWB mounted contactors also distribute power to other PWB mounted components through circuit traces formed onto the PWB.

Each contactor is mounted directly to the PWB and is simplified. The contactor consists of the primary motor which actuates the three primary power contacts and one position switch on the end of the contactors actuation stem. This simplification is possible as the support functions such as coil drivers, economizing switches, and auxiliary switches are PWB mounted components that communicate through the board circuit traces rather than the heretofore required wiring harnesses, mechanical switches and support brackets The system can now be supported with as many logic signals as needed without further mechanical interfaces on the contactor. The contactor LRU chassis is reduced or removed with only one position switch to protect.

The present invention therefore provides an uncomplicated line replaceable module with a minimum of wire harness connections, improved reliability and reduced maintenance considerations when located within an aircraft environment.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENT

Figure 1A:
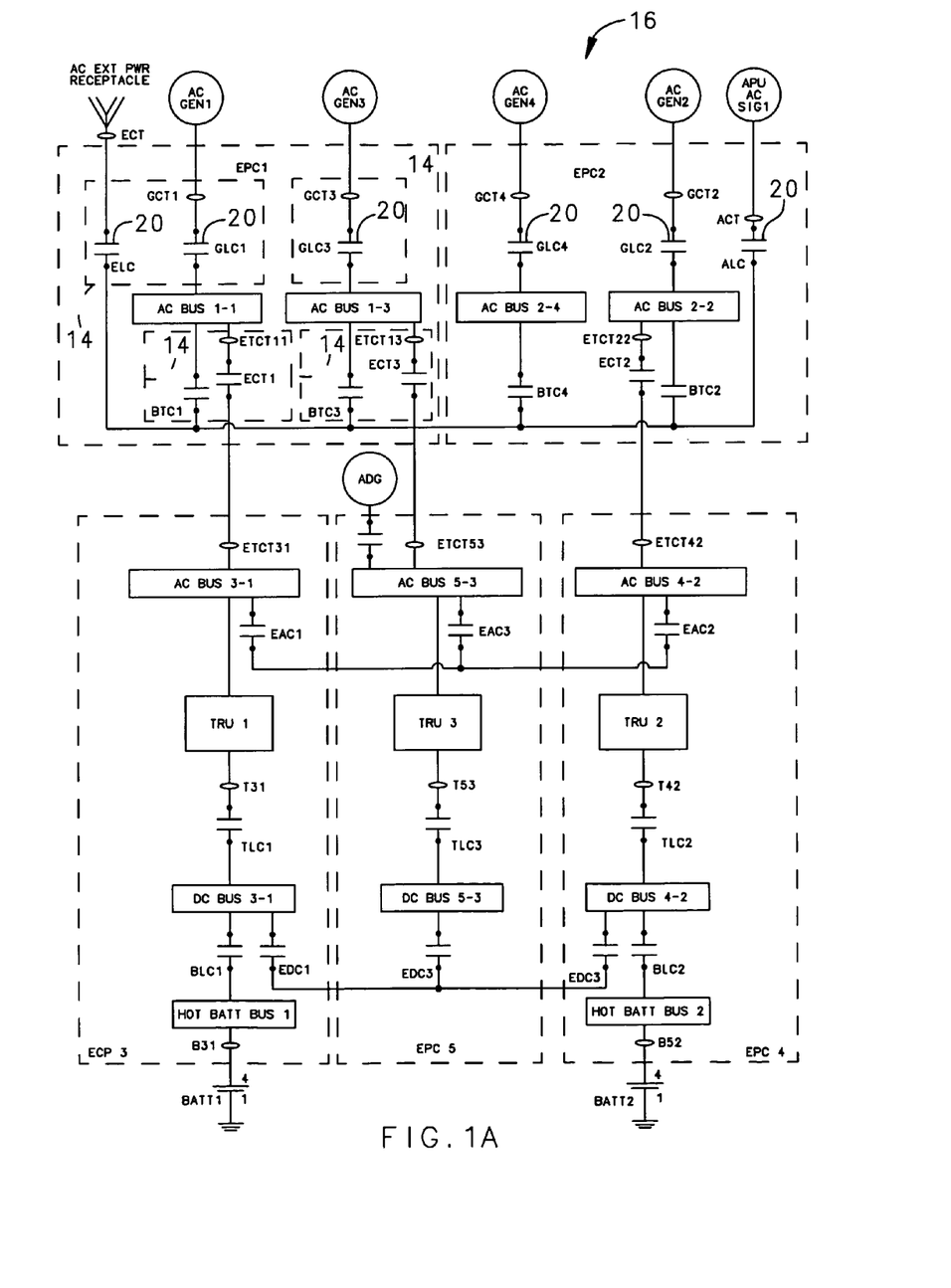
FIGS. 1A and 1B are general schematic views an electrical distribution system for use with the present invention.
Figure 1B:
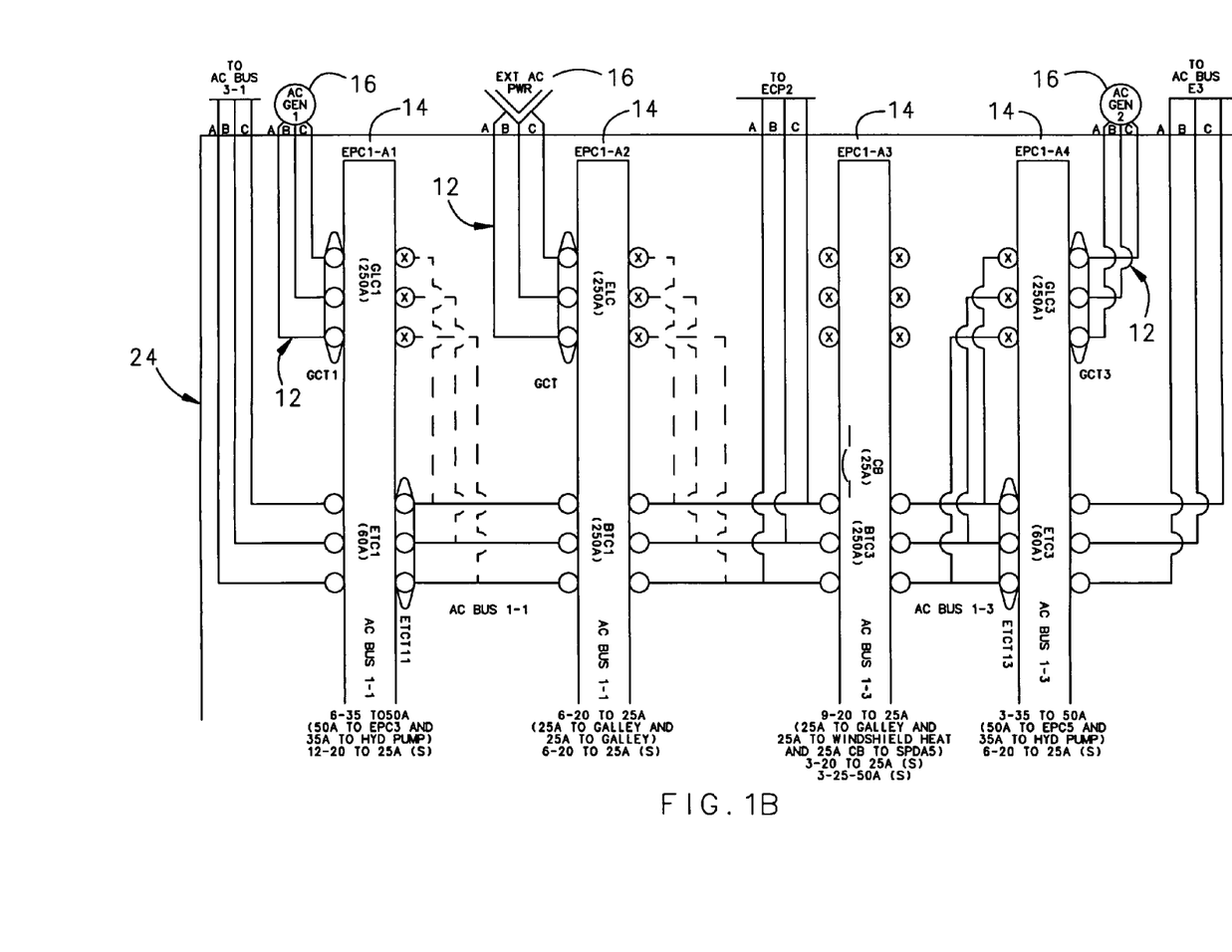

FIGS. 1A and 1B illustrate a general schematic view of an electrical distribution system 10 preferably for use with an aircraft. It should be understood that the present invention is not limited to just aircraft environments as various vehicles and stationary emplacements which utilize a multitude of power sources will benefit from the present invention.

The system 10 generally includes a multiple of primary power distributing bus bars 12 which power a plurality of loads which are primary power distributing Line Replaceable Modules (LRMs) 14. The LRMs 14 disclosed herein are primary power panels which communicate power on the order of hundreds of amps. From the LRMs 14, power is distributed to secondary bus bars (FIG. 1A) for distribution to vehicle subsystems at the desired power level typically on the order of tens of amps. Each power distributing bus bar 12 is powered by electrical energy generated from one of a multitude of electrical power source 16 such as a generator, driven by an engine of the aircraft, an auxiliary power unit APU or batteries.

Each LRM 14 includes an interconnection contactor 20 which is selectively controlled such that power may be received from one of a multiple of the sources 16. That is, the LRM 14 mounts the contactor 20 directly to a printed wire board (PWB) 22 of the LRM 14 rather than to the primary bus structure on the primary distribution assembly. Each PWB 22 includes a multiple of contactors 20. Each contactor communicates power from one source 16 to the LRM 14.

Figure 2:
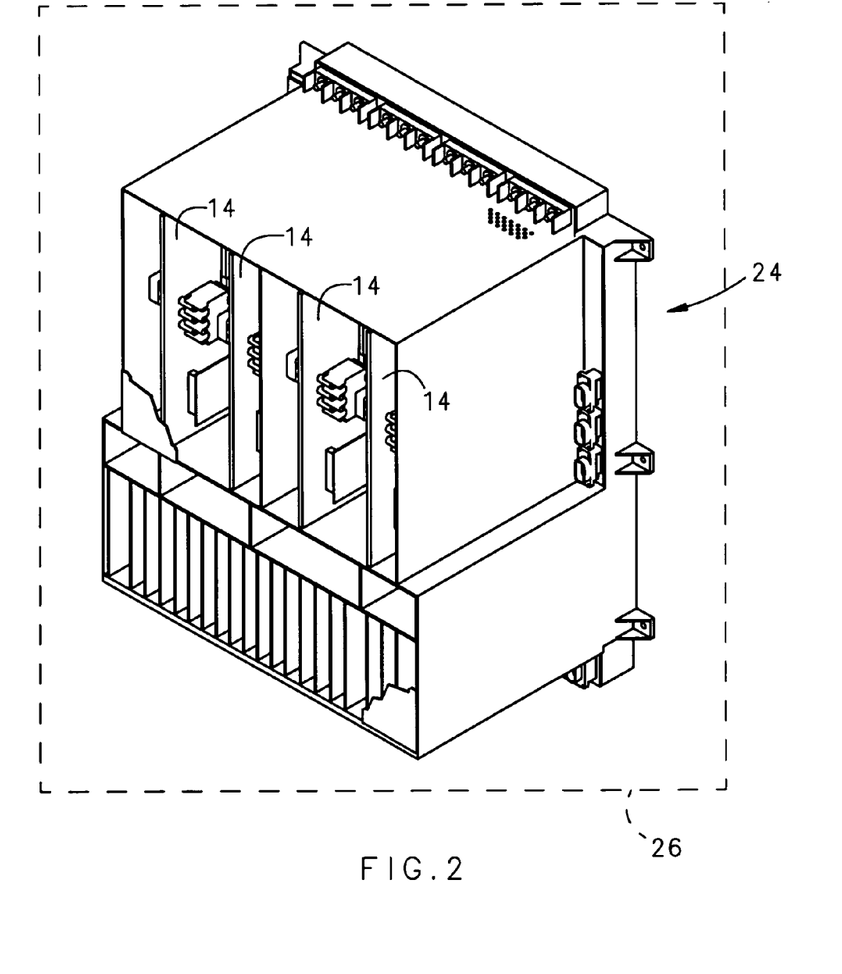
FIG. 2 is a schematic perspective view of a chassis for a multitude of line replaceable modules for use with the present invention.

Referring to FIG. 2, each of the LRMs 14 are mounted within a chassis 24 which includes the power distributing bus bar 12 typically located on an aft portion thereof. That is, the primary power distributing bus bar 12 is typically mounted to a chassis 24 such that the LRM 14 may be connected directly thereto. Preferably, the chassis 24 is mounted within a vehicle bay 26 (illustrated schematically) and the LRMs 14 are slid into the chassis 24 such that the contactors 20 are in communication with the respective bus bar 12.

Figure 3A:
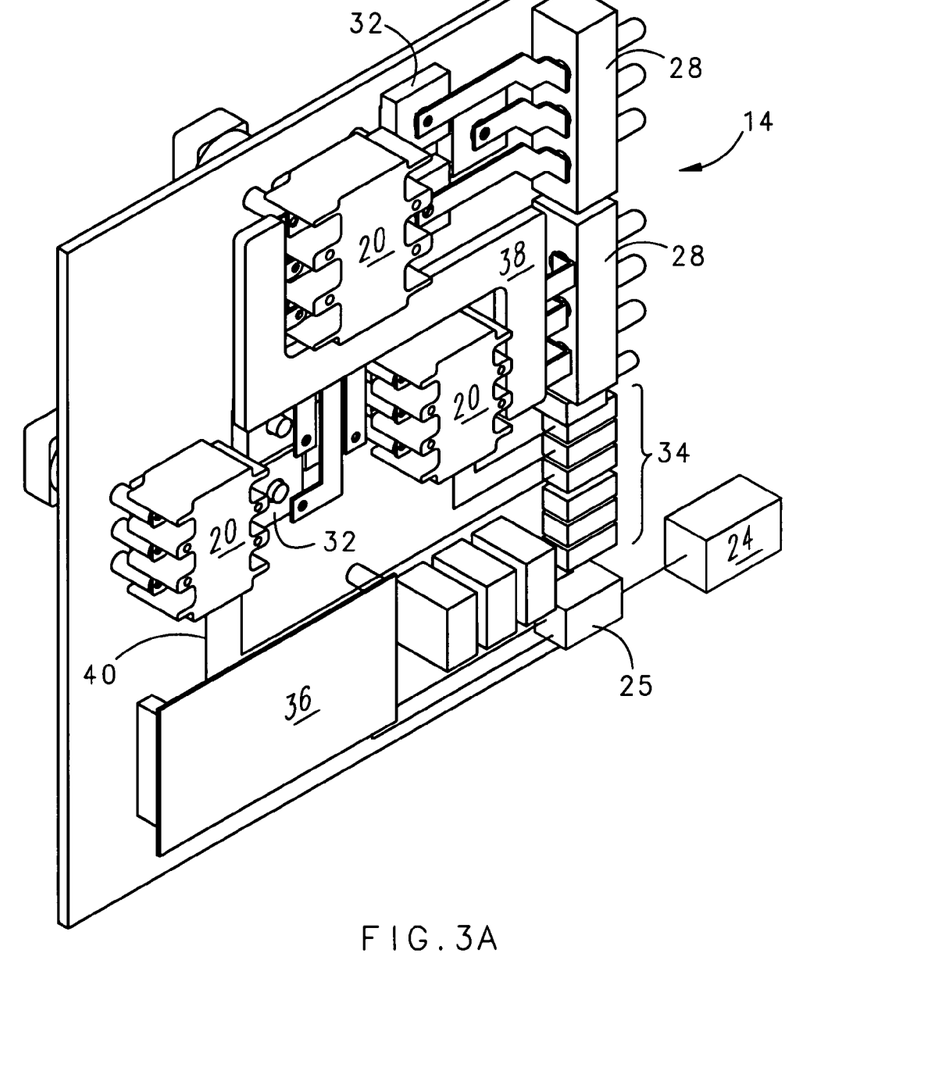
FIG. 3A is a schematic perspective view of a line replaceable module for use with the present invention.

Referring to FIG. 3A, each LRM 14 preferably includes the PWB 22 which is of a relatively thick construction. The PWB 22 is manufactured of a relatively thick construction to provide structural support for a multitude of electrical components as well as the board mounted contactors 20. The PWB 22 may be approximately 0.25 inches thick, however, it should be understood that various board thicknesses that provide the desired structure may be utilized with the present invention.

Figure 3B:
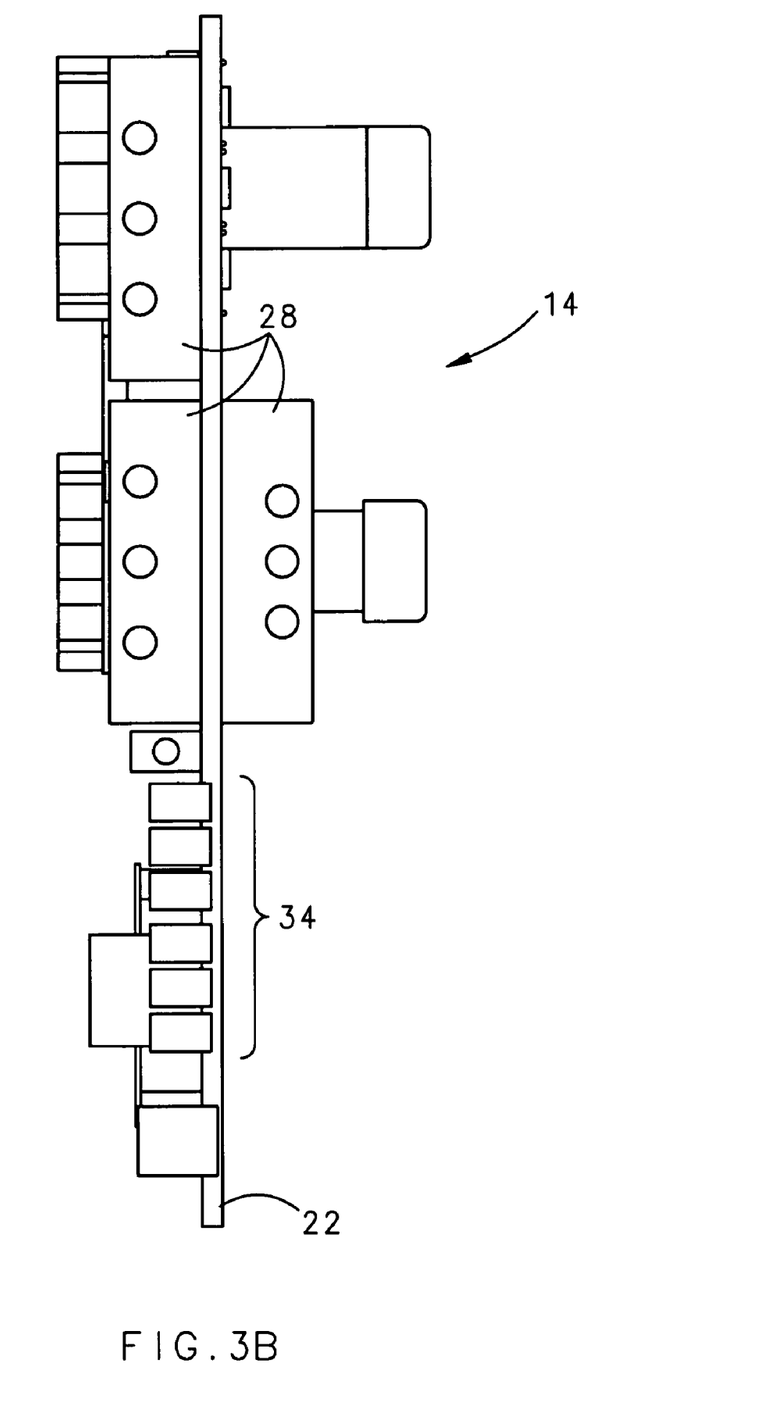
FIG. 3B is an aft view of a line replaceable module for use with the present invention.

The PWB 22 generally supports and electrically interconnects the contactors 20, power interface connectors 28, auxiliary switches (mounted on the onboard controller board assembly) 30, current sensors 32, control interface connectors 34, and an onboard controller 36. The power interface connectors 28 (FIG. 3B) preferably include supply connections 38 which communicate power from the power distributing bus bar 12 (FIG. 1), to each of the contactors 20 which then distribute power to the other PWB 22 mounted components through a combination of bus and circuit traces 40 (illustrated schematically) formed onto the PWB 22, depending on the current. The circuit traces 40 provide communication paths between the components as generally understood and transfer information such as the contactor 20 position sensed by the board mounted auxiliary switches 30 to a higher level controller (illustrated schematically at 42) such as a flight controller through a control interface connectors 35.

Figure 4A:
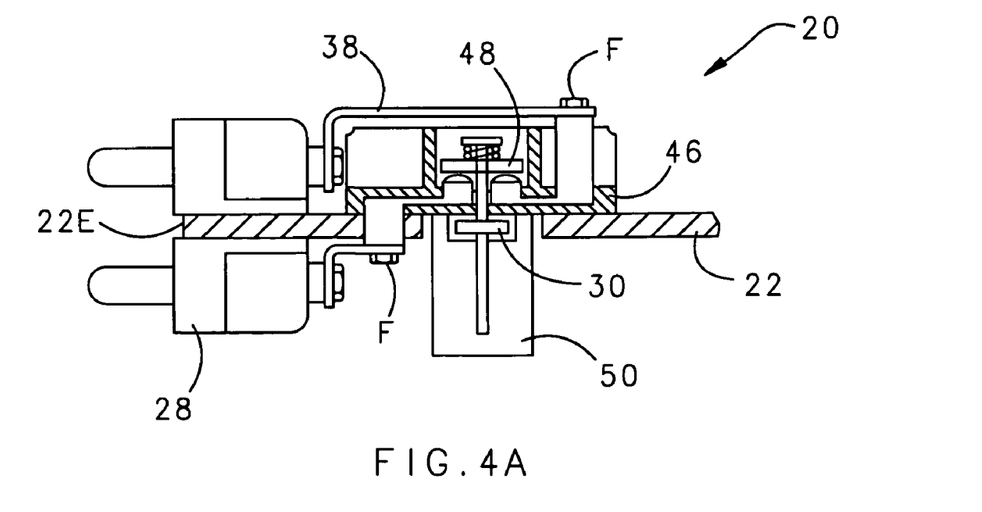
FIG. 4A is a sectional view of a contactor for use with the present invention.

Referring to FIG. 4A, each contactor 20 is mounted directly to the PWB 22. The contactor 20 may thereby be of a relatively straightforward construction in which the PWB 22 becomes the contactor 20 support structure. As the primary switch function is board mounted, support functions such as coil drivers, economizing switches, and auxiliary switches are also board mounted components that are assembled to the PWB 22 for communication through the circuit traces 40 rather than the heretofore required wiring harnesses.

Figure 3C:
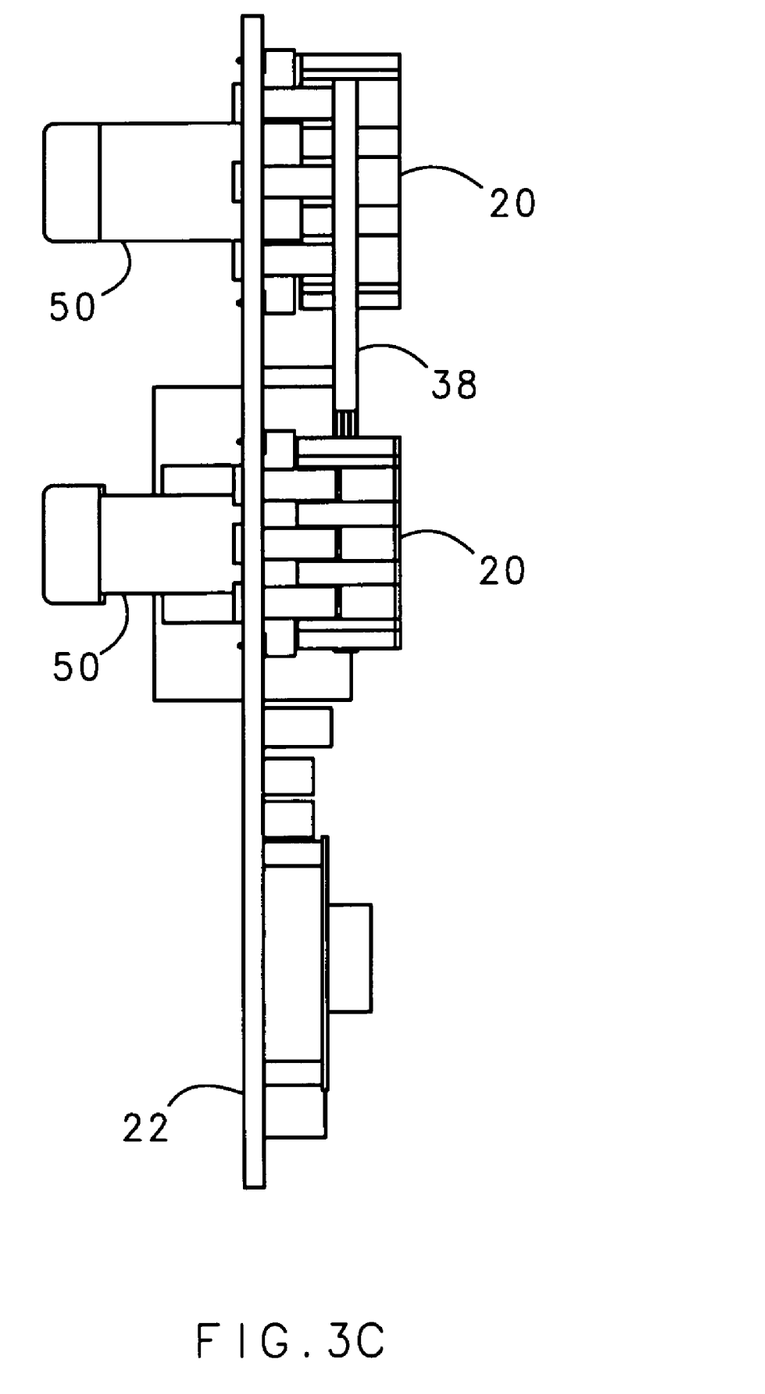
FIG. 3C is a forward view of a line replaceable module for use with the present invention.
Figure 4B:
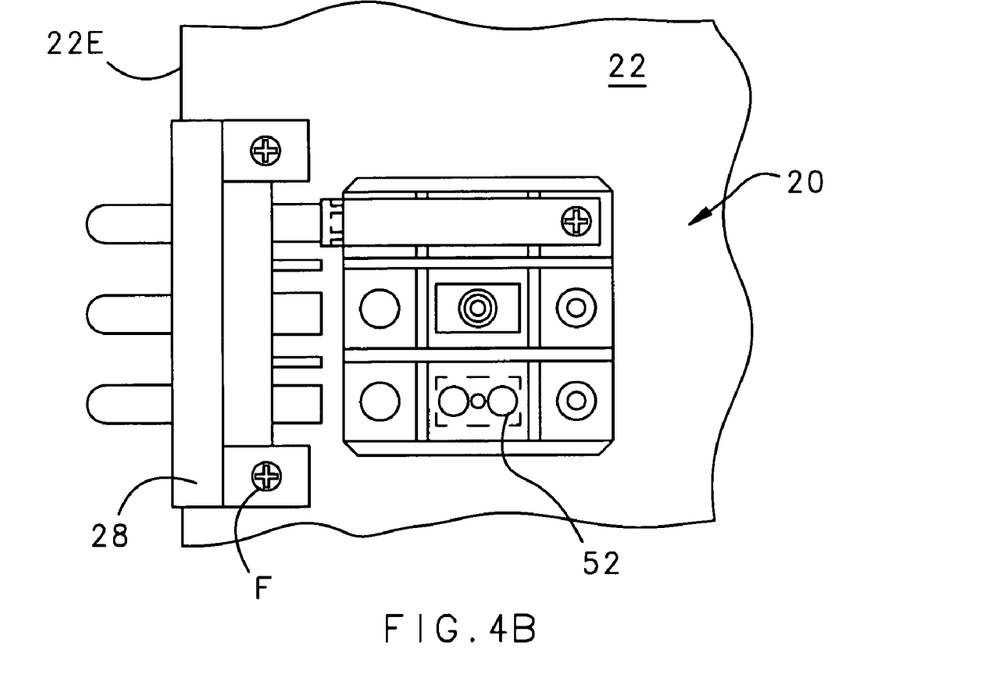
FIG. 4B is a top partial sectional view of a contactor for use with the present invention.

Preferably, the contactor 20 includes a housing assembly 46, a movable plunger 48, and an actuator 50 such as a solenoid. The housing assembly 46 is preferably attached to the PWB 22 through fasteners f such as screws or the like (also illustrated in FIG. 4B). The power interface connectors 28 are also preferably attached adjacent an edge 22E of the PWB 22 through fasteners f such as screws or the like (also illustrated in FIG. 4B). The power interface connectors 28 communicate electrical power to contacts 52 mounted to the contactor housing 46 though the supply connection 38. Notably, only the relatively high power supply connection 38 which communicate power from the power interface connectors 28 to each of the contactors 20 do not utilize the circuit traces formed directly onto the PWB 22. The power interface connectors 28 include a multiple of pins 28P. The multiple of pins 28P. in the disclosed non-limiting embodiment, include three pins 28P on one side of the PWB 22 and a three pins below the PWB 22. It should be understood that although the supply connections 38 are illustrated herein as separate from the PWB 22, the supply connections 38 may alternatively be PWB 22 circuit traces. The contacts 52 are selectively closed by the plunger 48 which is driven by the actuator 50. Preferably, the actuator 50 is mounted at least partially through the PWB 22 to minimize packaging volume of the LRM 14 (also illustrated in FIG. 3C). The actuator 50 communicates with the controller and receives power through the circuit traces 40 on the PWB 22

The auxiliary switch 30 is preferably mounted adjacent to the plunger 48 (illustrated somewhat schematically) and within housing assembly 46 to detect movement of the plunger 48. The auxiliary switch 30 communicates with the controller 36 through the circuit traces 40 on the PWB 22.

As each of the auxiliary components which supports operation and position functions for the contactor 20 are mounted to the PWB 22, communication with the controller 36 and the higher level controller 42 is readily facilitated. That is, the controller 36 preferably converts information from each of the board mounted auxiliary components to digital signals which may then be communicated to the higher level controller 42 and throughout the vehicle. The contactor 20 is thereby relatively uncomplicated since the only non-board mounted electrical communication path is preferably only that between the bus bar 12 and the contactor 20. A rather elegant and uncomplicated power communication arrangement between the LRMs 14 and the bus bar 12 is thereby provided.

It should be understood that relative positional terms such as "forward," "aft," "upper," "lower," "above," "below," and the like are with reference to the normal operational attitude of the vehicle and should not be considered otherwise limiting.

It should be understood that although a particular component arrangement is disclosed in the illustrated embodiment, other arrangements will benefit from the instant invention.

Although particular step sequences are shown, described, and claimed, it should be understood that steps may be performed in any order, separated or combined unless otherwise indicated and will still benefit from the present invention.

The foregoing description is exemplary rather than defined by the limitations within. Many modifications and variations of the present invention are possible in light of the above teachings. The preferred embodiments of this invention have been disclosed, however, one of ordinary skill in the art would recognize that certain modifications would come within the scope of this invention. It is, therefore, to be understood that within the scope of the appended claims, the invention may be practiced otherwise than as specifically described. For that reason the following claims should be studied to determine the true scope and content of this invention.

What is claimed is:

1. A contactor mounted to a printed wire board comprising: a contactor housing assembly attached to the printed wire board; a power interface connector attached adjacent an edge of the printed wire board, said power interface connector in electrical communication with a contact through a supply connection; a movable plunger mounted at least partially within said contactor housing and at least partially through the printed wire board; and an actuator mounted at least partially through the printed wire board, said actuator operable to move said plunger between an open position displaced from said contact and a closed position in contact with said contact, further comprising an auxiliary position switch in communication with said movable plunger, said auxiliary switch operable to identify said open position and said closed position.

2. A line replaceable module comprising:
   a printed wire board; and a contactor mounted to said printed wire board, said contactor comprises: a contactor housing assembly attached to said printed wire board;
   a power interface connector attached adjacent an edge of said printed wire board, said power interface connector in electrical communication with a contact through a supply connection; a movable plunger mounted at least partially within said contactor housing and at least partially through said printed wire board; and an actuator mounted at least partially through said printed wire board, said actuator operable to move said plunger between an open position displaced from said contact and a closed position in contact with said contact, further comprising a controller mounted to said printed wire board, said controller in electrical communication with said contactor through a circuit trace on said printed wire board.

3. The line replaceable module as recited in claim 2, wherein said printed wire board is approximately 0.25 inches thick.

4. The line replaceable module as recited in claim 2, wherein said printed wire board is a structural member.

5. The line replaceable module as recited in claim 2, further comprising an electrical component mounted to said printed wire board, said electrical component in electrical communication with said contactor through a circuit trace on said printed wire board.

6. The line replaceable module as recited in claim 2, further comprising a controller mounted to said printed wire board, said controller in electrical communication with said contactor through a circuit trace on said printed wire board.

7. An electrical distribution system comprising:
   a power distributing bus bar; and a line replaceable module including a printed wire board and a contactor mounted to said printed wire board, said contactor comprising:
   a contactor housing assembly attached to said printed wire board;
   a power interface connector attached adjacent an edge of said printed wire board, said power interface connector in electrical communication with a contact through a supply connection, said power interface connector removably connectable to said power distributing bus bar; a movable plunger mounted at least partially within said contactor housing and at least partially through said printed wire board; and an actuator mounted at least partially through said printed wire board, said actuator operable to move said plunger between an open position displaced from said contact and a closed position in contact with said contact, further comprising an auxiliary switch in communication with said contactor to determine a position of said contactor, said auxiliary switch in electrical communication with said controller through a circuit trace on said printed wire board.

8. The electrical distribution system as recited in claim 7, wherein said power distributing bus bar is mounted within a chassis, said line replaceable module mountable within said chassis.

9. The contactor as recited in claim 1, wherein said contact is mounted to said contactor housing.

10. The contactor as recited in claim 9, wherein said supply connection includes a first supply connection in electrical communication with a first contact and a second supply connection in electrical communication with a second contact.

11. The contactor as recited in claim 10, wherein said first supply connection extends along one side of the printed wire board and the second supply connection extends along an opposite side of the printed wire board.

12. The line replaceable module as recited in claim 2, wherein said power interface connectors include a multiple of pins.

13. The line replaceable module as recited in claim 12, wherein said multiple of pins include three pins on one side of the printed wire board and three pins below the printed wire board.

14. The contactor as recited in claim 1, wherein said movable plunger is transverse to said power interface connector.

15. The line replaceable module as recited in claim 12, wherein said multiple of pins include a first multiple of pins on one side of the printed wire board and a second multiple of pins on an opposite side of the printed wire board.

16. A contactor mounted to a printed wire board comprising:
   a contactor housing assembly attached to the printed wire board;
   a power interface connector attached adjacent an edge of the printed wire board, said power interface connector in electrical communication with a contact through a supply connection, said power interface connectors include a first multiple of pins on one side of the printed wire board and a second multiple of pins on an opposite side of the printed wire board; a movable plunger mounted at least partially within said contactor housing and at least partially through the printed wire board; and
   an actuator mounted at least partially through the printed wire board, said actuator operable to move said plunger between an open position displaced from said contact and a closed position in contact with said contact, further comprising an auxiliary switch in communication with said contactor to determine a position of said contactor, said auxiliary switch in electrical communication with said controller through a circuit trace on said printed wire board.

* * * * *